United States Patent
Huang et al.

(10) Patent No.: US 6,356,213 B1
(45) Date of Patent: Mar. 12, 2002

(54) SYSTEM AND METHOD FOR PREDICTION-BASED LOSSLESS ENCODING

(75) Inventors: Dawei Huang, Brisbane (AU); Bin Yu, Summit, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/583,601

(22) Filed: May 31, 2000

(51) Int. Cl.[7] .............................................. H03M 7/00
(52) U.S. Cl. ..................... 341/60; 375/240.14; 375/245
(58) Field of Search ................ 341/60, 56; 375/340.24, 375/242, 240.01; 704/205, 213, 212; 370/480

(56) References Cited

U.S. PATENT DOCUMENTS

| | | | | |
|---|---|---|---|---|
| 4,571,737 A | * | 2/1986 | Nishitani et al. | 375/245 |
| 4,716,453 A | * | 12/1987 | Pawelski | 375/240.01 |
| 4,791,670 A | * | 12/1988 | Copperi et al. | 704/222 |
| 4,853,780 A | * | 8/1989 | Kojima et al. | 375/240.14 |
| 4,860,355 A | * | 8/1989 | Copperi | 704/213 |
| 5,651,090 A | * | 7/1997 | Moriya et al. | 704/200.1 |
| 5,699,483 A | * | 12/1997 | Tanaka | 704/219 |
| 5,946,043 A | * | 8/1999 | Lee et al. | 375/240.24 |
| 6,055,496 A | * | 4/2000 | Heidari et al. | 704/222 |

* cited by examiner

Primary Examiner—Peguy Jeanpierre
Assistant Examiner—Jean Bruner Jeanglaude

(57) ABSTRACT

A lossless encoding methodology is described based on residual coding techniques and using a modified Least Mean Squares methodology to develop a predictor for a signal to be encoded, and a residual as the difference between the signal and its predicted value. After the residual for an input signal segment is obtained according to the method of the invention, that method is again applied to the residual value process to develop a second predictor, from which a second residual value is obtained. The method is then applied for at least one further iteration to the most recently obtained residual value process to develop a third predictor for the signal to be encoded. A single prediction value is then selected as a statistical representative of those multiple predictor values. The residual value to be used for encoding the input signal increment is determined as the difference between the signal value and the selected predictor value.

20 Claims, 2 Drawing Sheets

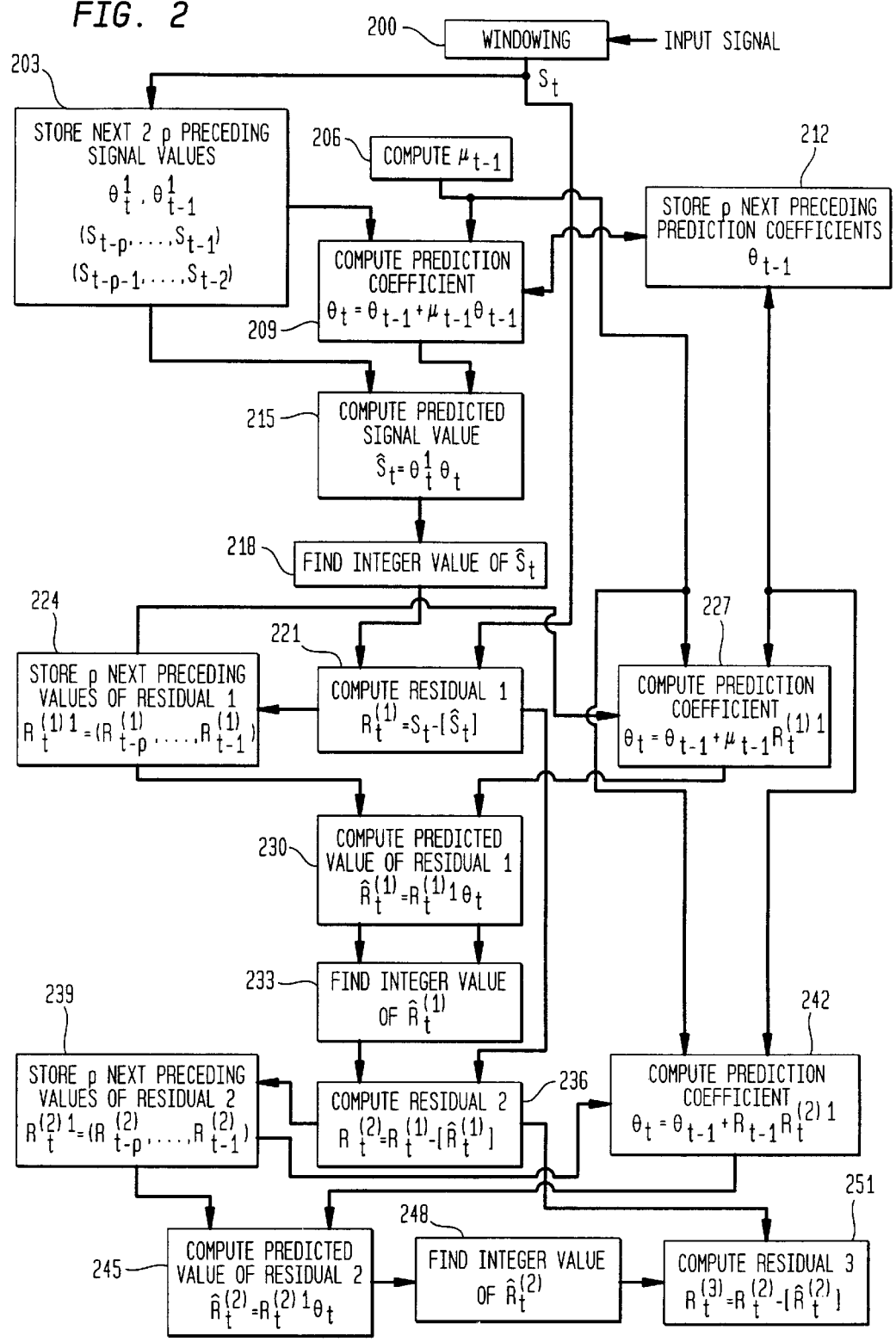

SYSTEM AND METHOD FOR PREDICTION-BASED LOSSLESS ENCODING

FIELD OF THE INVENTION

This application is related to the art of information coding and more particularly to prediction-based coding of such information.

BACKGROUND OF THE INVENTION

In the storage or transmission of information, it is frequently necessary to compress the data content of the information. Typically an information signal waveform (which may be a pure digital signal or a digitized analog signal) will consist of signed 16 bit numbers and there will be significant sample-to-sample correlation. Accordingly, a compression utility for these signals will desirably take advantage of the sample-to-sample correlation.

For signals which exhibit (or are expected to exhibit) such sample-to-sample correlation, compression is commonly achieved through prediction coding, where the goal is to use some portion of the preceding set of data to predict the next character in the data stream. The predicted value is then compared with the actual value of the predicted character, and a difference between the predicted and actual values is determined. That difference, or "residual" as it is usually denoted, which will ordinarily be much smaller in magnitude than the actual character value, is then used to code for that actual value.

All types of compression fall into one of two categories: lossless and lossy. Lossless compression schemes enable all of the compressed data to be recovered after decompression. Lossy compression, on the other hand, connotes some loss of data between the original signal and the resultant of the compression/decompression process. In general, lossy compression methods are designed with a goal of making the loss of data largely immaterial to the receiving application. Lossy compression methods also generally provide a significantly greater compression ratio than can be obtained with lossless compression methods.

In many cases, linear prediction has been used in lossy speech coding. For example, linear predictive coding (LPC) and adaptive pulse code modulation (ADPCM) both have a prediction component, and also provide the foundation for other encoding techniques. Many speech coding standards are based on these. For example, Coded Excitation Linear Prediction (CELP) uses LPC and encodes residuals using a codebook of residuals from test speech samples. CCITT Standard G.721, used in digital telephone systems, builds on ADPCM (32 kb/s), while CCITT Standard G.728 (16 kb/s) uses a variant of CELP.

For music coding, on the other hand, the dominant form of coding has been based on perceptual and frequency domain characteristics—the most widely-used method/standard being MPEG. Basically, perceptual coding exploits limitations of human hearing to remove inaudible components of audio signals. And, because the signal energy is concentrated in only certain areas of the frequency spectrum, these parts of the spectrum can be encoded with more resolution than the low-energy parts. Various transforms may be used to indicate what frequencies are contained in the signal, and their magnitudes. In the most recent MPEG version (MPEG-4, which is directed primarily to multimedia applications), either the discrete cosine transform (DCT) or the Fourier transform may be used. Since only significant frequencies are coded with perceptual coding (other frequencies being discarded), that coding results in lossy compression.

In general, the known speech coders do a poor job of encoding music and vice versa, although it can be important to be able to compress well both types of signals for certain applications such as for movie sound signals. There are other applications, including evidentiary matters, where any difference between an original and a reproduced signal is unacceptable, and thus lossy encoding cannot be used. Moreover, while a lay person may find music which has been subject to lossy encoding to be indistinguishable from the original, trained musicians may hear the differences between the original and compressed music, and find the lossy encoding to be unacceptable.

SUMMARY OF THE INVENTION

Accordingly, it is an object of the invention to provide a lossless coding methodology that effectively encodes both speech and music. To that end, a lossless encoding methodology is disclosed based on residual coding techniques and using a modified Least Mean Squares methodology to develop a predictor for a signal to be encoded, and a residual as the difference between the signal and its predicted value. After the residual for an input signal segment is obtained according to the method of the invention, that method is again applied to the residual value process to develop a second predictor, from which a second residual value is obtained. The method is then applied for at least one further iteration to the most recently obtained residual value process to develop a third predictor for the signal to be encoded. A single prediction value is then selected as a statistical representative of those multiple predictor values, or as a weighted combination of the multiple predictor values. The residual value to be used for encoding the input signal increment is determined as the difference between the signal value and the selected predictor value. The method of the invention encodes integer-valued digital signals by first obtaining an integer-valued predictor and then coding losslessly the prediction residuals, which are also integers.

BRIEF DESCRIPTION OF THE DRAWINGS

FIG. 2 shows a flow chart for a prediction coding methodology according to the method of the invention.

DETAILED DESCRIPTION OF THE INVENTION

Figure 1:
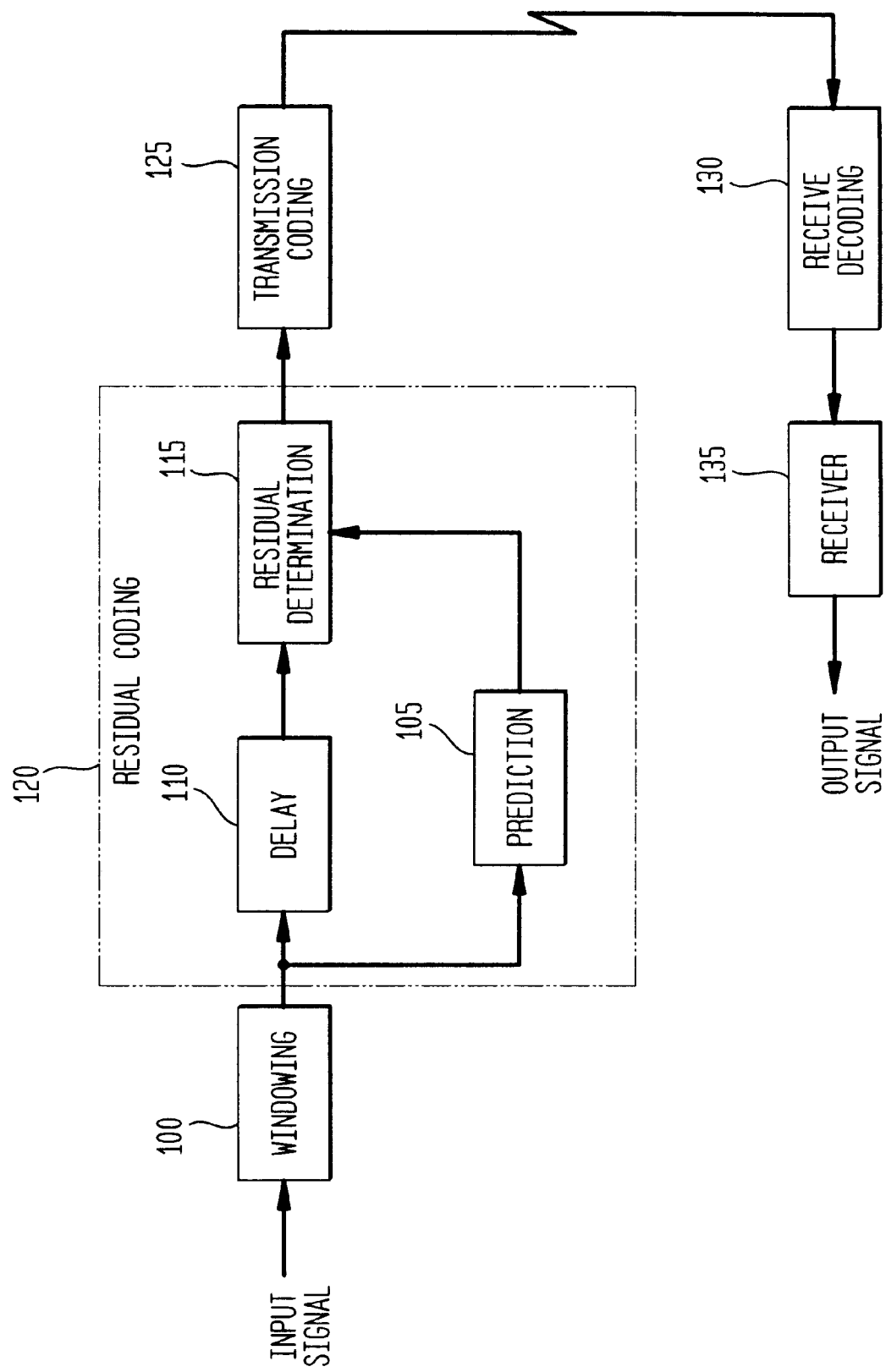
FIG. 1 depicts a signal transmission arrangement for a residually coded signal

In the transmission or storage of information, it is often desirable to achieve a compression of a signal representing that information in order to maximize information throughput, or storage, for a transmission or storage medium having limited carrying or storage capacity. Commonly, such signal compression is achieved by use of a predictive coding technique. In such a coding/compression approach, the value of a given signal increment is compared with a predicted value for that signal increment, and the difference between the actual and predicted values, denoted a "residual", is used to code for the value of that signal increment. Because both the prediction algorithm and the input data necessary to predict a current signal value are known at both the transmission and receiving ends of the signal path, that residual value can readily be transformed back to the coded signal value at the receiving end.

In practice, signal compression using residual coding is achieved by building a prediction model of the signal waveform. An established model in the art is that of an autoregressive model, also known as linear predictive coding (LPC). With this model, the predicted signal, ŝ(t), is a linear combination of past samples of the actual signal, s(t). Stated algebraically:

$$\hat{s}(t) = \sum_{i=1}^{p} a_i s(t-i)$$

where p is the prediction order and the $a_i$ are prediction coefficients. The coded signal, or residual, $e_t$, is the difference between the estimate of a signal increment under consideration, ŝ(t), and the actual signal increment, s(t)—i.e., e(t)=s(t)−ŝ(t).

This prediction approach assumes that the signal waveform is relatively unchanging. However, many waveforms of interest experience variation over time, and thus the values of the prediction coefficients, $a_i$, needed to provide a good prediction of the signal value will vary from one section of the waveform to another. It is often reasonable to assume that the signal waveform is pseudo-stationery for some time increment—i.e., there exists a time-span over which a reasonable, and fixed, set of values for the prediction coefficients can be found. Thus, prediction coding usually includes a pre-coding step of blocking, or windowing the input signal into a sequence of consecutive signal segments which are expected to satisfy the requirement of relative waveform constancy within the duration of the windowed time segment.

The time frame over which input signal samples are blocked depends to some extent on the nature of the signal. It is inefficient to block on too short a time scale, as this incurs an overhead in the computation and transmission of the prediction parameters. It is also inefficient to use a time scale over which the signal characteristics change appreciably, as this will result in a poorer prediction model for the signal.]

FIG. 1 depicts schematically a signal transmission arrangement in which signal compression is achieved via a predictive coding methodology. As can be seen in figure, an input signal is initially operated on by a Windowing function 100, which operates to segment the input signal into discrete blocks of a size believed to represent a pseudo-stationery portion of the input signal. Each signal block is then successively applied as an input to Residual Coding function 120, which includes a Prediction function 105, a Delay function 110 and a Residual Determination function 115. Prediction function 105 provides a predicted value of the input signal segment and Delay function 110 operates to delay the input signal segment by a time increment equal to the processing time for the Prediction function.

Thus, the actual value of the signal segment (from Delay function 110) and the predicted value of that signal segment (from Prediction function 105) arrive at Residual Determination function 115 at substantially the same time. With the LPC methodology, that Residual Determination function operates to determine the difference between the actual and predicted values of the signal segment under consideration.

The output of the Residual Determination function is a "residual" value that is used to code for the input signal segment value. The coded residual values are typically subjected to further Transmission Coding, at 125, and then transmitted over a transmission link to a Receive Decoding function 130, which reverses the Transmission Coding function. The output of the Receive Decoding function will be the recovered residual value, which is then applied as an input to a Receiver 135. The Receiver is operative to compute the predicted value off the current signal segment, and to thereby recover the actual value of that signal segment as a sum of the predicted value and the transmitted residual value.

When the Residual Coding function 130 is carried out using the LPC methodology described above, the prediction coefficients, $a_i$, will change from one input windowed interval to the next. Accordingly, it is necessary to transmit those coefficients to the receiver as a necessary decoding parameter for each windowed signal segment. The inventors have developed a new on-line residual coding method that improves on the LPC method in various respects, but particularly in providing a high quality coding of mixed signals of music and speech, and avoiding the necessity for transmission of the prediction coefficients to the receiver for successive input signal segments. That improved on-line residual coding method is described hereafter, initially in terms of the overall scope of the inventive methodology, along with needed parameter development for that methodology, and subsequently through a flow-chart description of the steps for carrying out that methodology.

The prediction model for the on-line residual coding methodology of the invention is based on a modified Least Mean Squares (LMS) methodology. LMS is a well-known stochastic gradient algorithm which operates to adaptively minimize a cost function—here, the prediction algorithm. The prediction model for the methodology of the invention is of the form:

$$\hat{S}_t = \phi_t' \theta_t, \quad (1)$$

where $\phi_t'$ is a 1×p vector representing the p input signal values preceding the current (at time t) signal value, $S_t$—i.e., $\phi_t' = (S_{t-p}, \ldots, S_{t-1})$, and p is the order of the prediction model. As is known in the art, the prediction order, p (which will be empirically chosen by a system operator), generally reflects a trade-off between "goodness" of the prediction and computational complexity—i.e., accuracy of the prediction generally increases with increasing p, but so do the computational resources required to carry out the prediction algorithm.

The prediction coefficient, $\theta_t$, is similarly a 1×p vector and is determined as:

$$2_t = 2_{t-1} + \mu_{t-1} N_{t-1} \quad (2)$$

As will be understood, $2_{t-1}$ and $N_{t-1}$ are also 1×p vectors, while: $\mu_{t-1}$ is a scaler quantity.

Since $\phi_t'$ is a vector representing the p preceding input signal values (and $\phi_{t-1}'$ another vector representing the next-preceding p input signal values), those values are all known at the time of processing the current signal value, and thus those vectors can be readily determined. In order to choose parameters $2_t$ and: $\mu_{t-1}$, an initialization at time 0 is chosen, with $$N'_0 = (0, 0, \ldots, 0), \, 2'_0 = (1/p, \ldots, 1/p).$$

At time t, $2_{t-1}$ and $\phi_{t-1}$ are known, and $$2_t = 2_{t-1} + \mu_{t-1} N_{t-1}$$

Therefore, determination of the prediction coefficient vector, $\theta_t$, requires only a determination of the scaler, $\mu_{t-1}$. To find $\mu_{t-1}$, a modified LMS is used as the criterion by minimizing $$(S_{t-1} - N'_{t-1} 2_{t-1})^2 + 8 \|N_{t-1}\|^2 \|2_{t-1} - 2_{t-2}\|^2,$$

where 8 is a smoothing parameter which is determined empirically by a system operator for a given the input signal stream, and remains constant throughout each of the windowed single segments for such a signal stream.

The minimizer is found to be $$z_{t-1} = \frac{S_{t-1} - \phi'_{t-1}\theta_{t-1}}{(1+\lambda)\|\phi_{t-1}\|^2} \quad (3)$$

This leads to the updating formula for the prediction coefficient $2_t$:

$$2_t = 2_{t-1} + \frac{S_{t-1} - \phi'_{t-1}\theta_{t-1}}{(1+\lambda)\|\phi_{t-1}\|^2} N_{t-1} \quad (4)$$

The integer-valued predictor is the integer-round-off $$[\hat{S}_t] = \text{integer}[N'_t 2_t]$$

Then the residual is also integer valued and is equal to $$R_t = S_t - [\hat{S}_t] \quad (5)$$

Note that the rounded predictor is used for the preferred embodiment of the method of the invention, so that the residuals are integers and can be entropy coded. However, it should be understood that this is not an essential requisite of the invention.

As a further improvement in the coding efficiency of the method of the invention, the residual process may now be taken as the signal process and the modified LMS prediction repeated for the residual process to develop a second predictor for the signal to be encoded. In a preferred embodiment, the modified LMS prediction is repeated twice for the residual process; however it should be understood that greater or lesser numbers of repeat operations could be chosen. It is believed by the inventors that the number used for the preferred embodiment represents a good trade-off between coding-efficiency improvement and computational complexity. The two repeat operations, as carried out for the preferred embodiment, result in a further reduction of the residual size by up to 50%.

With the cascaded application of the prediction methodology to the resultant process of the preferred embodiment, three predictors, $P_1$, $P_2$ and $P_3$, are provided. In order to choose a single predictor for coding of the input signal sample value, one needs to determine a predictor which is statistically representative of the three computed predictors, $P_1$, $P_2$ and $P_3$. For the preferred embodiments, the inventors have determined that the single predictor will be selected as either the median of the three computed predictors or as a weighted average of those computed predictors. However, it should be understood that other known methods for determining a statistically representative value from a plurality of known values could also be applied within the scope of the invention. Once the predictor has been selected, the residual value that will code for the signal value is determined as the difference between that signal value and the selected predictor.

The steps of the residual coding methodology of the invention, according to a preferred environment, are illustrated in the flowchart of FIG. 2. With reference to that figure, the process of the invention begins with a Windowing step 200, which operates to segment the input signal into consecutive blocks, with the window size being chosen by a system operator according to a predetermined criterion, such criteria being well known in the art. For a given signal segment selected by the Windowing function, a signal sample, $S_t$, is output at time t.

As each signal sample is provided for coding by the method of the invention, that signal sample is also stored, at step 203, that step operating to store and maintain the two next-preceding p sets of input signal-sample values, relative to the signal sample currently being processed. As indicated above, the immediately preceding set of p input signal-sample values is designated $\phi_t'$ and includes the sample values $(S_{t-p}, \ldots, S_{t-1})$. Similarly, the next preceding set of p input signal-sample values is designated $\phi_{t-1}'$ and includes the sample values $(S_{t-p-1}, \ldots, S_{t-2})$. At step 206, the scalar parameter, $\mu_{t-1}$, is computed according to Equation 3 above. In step 209, the prediction coefficients, $\theta_t$, are computed using the values of $\phi_{t-1}'$ and $\mu_{t-1}$ from steps 203 and 206. As the prediction coefficients are computed for each sample value operated on by the method of the invention, those coefficients are also provided as an input to step 212, which operates to store the p next preceding set of prediction coefficients, designated as $\theta_{t-1}$. That previously computed set of prediction coefficients is similarly provided as an input to the Prediction Coefficient computation step, 209, for computation of the prediction coefficients for the next-following sample value.

The initial predicted value, $\hat{S}_t$, for the current input signal sample is then computed at step 215 as the vector product of $\phi_t'$ (from step 203) and $\theta_t$ (from step 209). That predicted value of the input signal sample is then rounded to the nearest integer, at step 218, and that integer value corresponds to the first predictor value, $P_1$, as described above. The predicted input signal value is subtracted from the actual signal value, at step 221, to provide a first residual value, $R_t^{(1)}$. As Residual 1 is computed for each signal-sample value processed, that residual value is provided to step 224, which operates to store the p next preceding values of residual 1, designated $R_t^{(1)\prime}$.

A predicted value of Residual 1 is then computed at step 230, as the product of the stored p preceding values of Residual 1, $R_t^{(1)\prime}$, and the prediction coefficient vector for the first residual process, as computed in step 227. [Note that the residual prediction coefficients are computed in the same manner as the signal prediction coefficients are computed in step 212—i.e., a factor of $\mu_{t-1}$ times the t−1 next p preceding values of Residual 1 added to the next preceding set of coefficient values (which will have been stored at step 212).] That predicted value of Residual 1, $\hat{R}_t^{(1)}$, is rounded to the nearest integer, $[\hat{R}_t^{(1)}]$, at step 233. The second predictor, $P_2$, is developed from the predicted value of Residual 1 as the integer value of the sum of $\hat{S}_t$ and $\hat{R}_t^{(1)}$—i.e., $P_2 = [\hat{S}_t + \hat{R}_t^{(1)}]$. A second residual value, $R_t^{(2)}$ (or Residual 2), is computed, at step 236, as the difference between the value of Residual 1 (from step 221) and the predicted value of Residual 1.

A predicted value of Residual 2, $\hat{R}_t^{(2)}$, is computed at steps 239, 242 and 245 in the same manner as for computation of the predicted value for Residual 1 at steps 224, 227 and 230. That predicted value of Residual 2 is rounded to the nearest integer, $[\hat{R}_t^{(2)}]$, at step 248. The third predictor, $P_3$, is developed from the predicted value of Residual 2 as the integer value of the sum of $\hat{S}_t$, $\hat{R}_t^{(1)}$ and $\hat{R}_t^{(2)}$—i.e., $P_3 = [\hat{S}_t + \hat{R}_t^{(1)} + \hat{R}_t^{(2)}]$. A third residual value, $R_t^{(3)}$ (or Residual 3), may be computed, at step 251, as the difference between the value of Residual 2 (from step 236) and the predicted value of Residual 2 (although Residual 3 is not needed if no further predictors are to be developed).

Thus, as can be seen, with the application of the prediction methodology of the invention to the signal process and to successive residual processes, a succession of predictors for the original signal is obtained. For the preferred embodiment of the invention, the LMS prediction methodology is applied three times, leading to three predictors, $P_1$, $P_2$ and $P_3$, for the signal value to be coded. As explained above, a single predictor for the current input signal sample is selected as being statistically representative of the three computed predictors. The selected predictor is then subtracted from the signal value being predicted to produce the residual value that will code for the signal.

Referring briefly back to FIG. 1, the residual value determined according to the method of the invention may be transmission coded, at the transmission coding function 125 for transmission to a receiving site. In a preferred embodiment of the invention, such transmission coding would be carried out using entropy coding, such as Huffman coding.

CONCLUSION

The invention provides a novel lossless encoding methodology based on residual coding techniques and using a modified Least Mean Squares methodology to develop the residual for a given input signal sample The method further operates to develop a plurality of cascaded predictors, with the second and subsequent predictors developed from application of the LMS methodology to the residual process for the previously-determined residual. The method concludes with a selection of a statistically representative predictor from the plurality of cascaded predictors, which is subtracted from the input signal sample value to determine a residual which is used to code for the input signal sample.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention and is not intended to illustrate all possible forms thereof. It is also understood that the words used are words of description, rather that limitation, and that details of the structure may be varied substantially without departing from the spirit of the invention and the exclusive use of all modifications which come within the scope of the appended claims is reserved.

What is claimed is:

1. A method for signal coding, comprising the steps of:
   a) identifying a segment of a signal for coding;
   b) determining a first predicted value for a given sample within said identified signal segment as a function of prior sample values;
   c) comparing an actual value with the first predicted value of said given sample and taking, as a primary residual value, a difference between said actual and said first predicted values;
   d) determining a second predicted value as a function of said first predicted value and of a predicted value for said primary residual value;
   e) taking, as a secondary residual value, a difference between said primary residual value and a predicted value thereof;
   f) repeating steps (d) and (e) at least once to find a further predicted value as a function of said first predicted value and of predicted values of said primary and secondary residual values; and
   g) selecting a predictor value as a statistical function of said first, said second and said further predicted values.

2. The method for signal coding of claim 1 wherein said predicted value for said primary residual value is determined as a function of residual values found for prior signal samples.

3. The method for signal coding of claim 1 wherein said selection of said predictor value is made by finding a median of said first, said second and said further predicted values.

4. The method for signal coding of claim 1 wherein said selection of said predictor value is made by finding a weighted average of said first, said second and said further predicted values.

5. The method for signal coding of claim 1 wherein a residual value to code for said given sample value is determined as a difference between said given sample value and said selected predictor value.

6. The method for signal coding of claim 5 wherein said residual value is further coded for transmission to a receiving location using entropy coding.

7. The method for signal coding of claim 1 wherein said step of determining a first predicted value for a given sample comprises the substeps of:

defining a prediction order, p, as a number of said prior samples on which said predicted value is based;

forming a 1×p vector representing signal values for a set of p input samples immediately preceding said given sample;

determining a set of prediction coefficients for prediction of said given sample, said set of prediction coefficients being established as a 1×p vector; and determining said predicted value as a vector product of said signal value vector and said prediction coefficient vector.

8. The method for signal coding of claim 7 wherein said set of prediction coefficients is determined by adding a product of a scale factor and a set of p preceding signal values to a set of prediction coefficients determined for a signal sample immediately preceding said given sample.

9. The method for signal coding of claim 8 wherein said scale factor is determined by a Least Mean Squares minimization of a defined cost function.

10. The method for signal coding of claim 7 wherein said set of prediction coefficients is determined as a function of prediction coefficients determined for a signal sample immediately preceding said given sample.

11. A method for signal coding comprising the steps of:
    a) selecting a signal sample for coding;
    b) defining a prediction order, p, as a number of prior signal samples for evaluation of a predicted value of said selected signal sample;
    c) forming a 1×p vector representing signal values for a set of p input signal samples immediately preceding said selected signal sample;
    d) determining a set of prediction coefficients for prediction of said selected signal sample, said set of prediction coefficients being established as a 1×p vector; and
    e) determining a first predicted value of said selected signal sample as a vector product of said signal value vector and said prediction coefficient vector; and
    f) comparing an actual value with said first predicted value for said selected signal sample and taking, as a primary residual value, a difference between said actual and first predicted values.

12. The method for signal coding of claim 11 wherein said set of prediction coefficients is determined as a function of prediction coefficients determined for a signal sample immediately preceding said given signal sample.

13. The method for signal coding of claim 11 wherein said set of prediction coefficients is determined by adding a product of a scale factor and a set of p preceding signal values to a set of prediction coefficients determined for a signal sample immediately preceding said given signal sample.

14. The method for signal coding of claim 13 wherein said scale factor is determined by a Least Mean Squares minimization of a defined cost function.

15. The method for signal coding of claim 11 including the further steps of:

g) determining a second predicted value as a function of said first predicted value and of a predicted value for said primary residual value;

h) taking, as a secondary residual value, a difference between said primary residual value and a predicted value thereof;

i) repeating steps g and h at least once to find a further predicted value as a function of said first predicted value and of predicted values of said primary and secondary residual values; and j) selecting a predictor value as a statistical function of said first, said second and said further predicted values.

16. The method for signal coding of claim 15 where in said selection of said predictor value is made by finding a weighted average of said first, said second and said further predicted values.

17. The method for signal coding of claim 15 wherein a residual value to code for said selected signal sample value is determined as a difference between said selected signal sample value and said selected predictor value.

18. The method for signal coding of claim 17 wherein said residual value is further coded for transmission to a receiving location using entropy coding.

19. The method for signal coding of claim 15 wherein said selection of said predictor value is made by finding a median of said first, said second and said further predicted values.

20. The method for signal coding of claim 15 wherein said predicted value for said primary residual value is determined as a function of residual values found for prior signal samples.

* * * * *